(12) United States Patent
Kato (10) Patent No.: US 7,978,098 B2
(45) Date of Patent: Jul. 12, 2011

(54) KEY INPUT DEVICE

(75) Inventor: Yasuhiro Kato, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 1121 days.

(21) Appl. No.: 11/787,510

(22) Filed: Apr. 16, 2007

(65) Prior Publication Data

US 2007/0290891 A1 Dec. 20, 2007

(30) Foreign Application Priority Data

May 31, 2006 (JP) ................................. 2006-151851

(51) Int. Cl.
*H03M 11/00* (2006.01)
(52) U.S. Cl. .......................................... 341/22; 341/26
(58) Field of Classification Search .................... 341/22, 341/26
See application file for complete search history.

(56) References Cited

FOREIGN PATENT DOCUMENTS

| JP | 3-9036 | 1/1991 |
|---|---|---|
| JP | 5-88806 | 4/1993 |

OTHER PUBLICATIONS

Utility Model Laying-Open Gazette for Japanese Publication No. 03-009036, Publication date Jan. 29, 1991 (2 pages).
Japanese Office Action for Japanese Application No. 2006-151851, mailed on Apr. 22, 2008 (4 pages).
Patent Abstracts of Japan for Japanese Publication No. 05-088806, Publication date Apr. 9, 1993 (1 page).

*Primary Examiner* — Brian A Zimmerman
*Assistant Examiner* — Hung Q Dang
(74) *Attorney, Agent, or Firm* — Osha Liang LLP (57) ABSTRACT

Key switches SW1-SW6 short-circuit one ends of resistors R corresponding thereto and a termination of a resistor string unit STR1, in accordance with inputs made by keys KEY1-KEY6 assigned thereto, respectively. The keys KEY1-KEY6 are made active in a period when the selection command SEL is at "P1", so that control unit 2 can identify which key is used to make an input, out of the keys KEY1-KEY6. The keys KEY7-KEY12 are made active in a period when the selection command SEL is at "P2", so that control unit 2 can identify which key is used to make an input, out of the keys KEY7-KEY12.

10 Claims, 6 Drawing Sheets

KEY INPUT DEVICE

BACKGROUND OF THE INVENTION

1. Field of the Invention

The present invention relates to a key input device identifying a key used to make an input, out of a plurality of keys, and particularly relates to a technique for enabling multiple key inputs.

2. Description of the Background Art

An electrical appliance, which operates in accordance with user's manipulations, generally has an input device for accepting a manipulation command. In many of the electrical appliances, a key (e.g. a manipulation button, a jog dial or the like) configured such that it can receive user's manipulations (e.g. a pressing force) is arranged at its panel surface, along with a display unit for displaying an operational state. In a multifunctional electrical appliance, in particular, there are arranged a number of keys corresponding to the number of functions. Accordingly, it is not uncommon that a few tens to a hundred (hundreds) of keys are arranged at the panel surface, for example, of the electrical appliance.

In order to cause the electric appliance to execute an operation in accordance with a key used to make an input, it is necessary to identify which key is used to make an input, out of such multiple keys. As one of the configurations identifying the key used to make an input, there has been known a configuration that generates a voltage value corresponding to a key used to make an input, by using a resistor string made of a plurality of resistors connected in series, and identifies the key based on the generated voltage value. For example, Japanese Utility Model Laying-Open No. 03-009036 discloses a circuit for inputting therein a plurality of pieces of switch information of a microprocessor system. This circuit has at least two lock switches and resistors connected in series, and the resistors are configured to be separated by the lock switches. A piece of switch information input independently is identified by appropriately selecting a resistance value of each of the resistors.

According to such a configuration as disclosed in Japanese Utility Model Laying-Open No. 03-009036, it is necessary to convert the generated voltage value into a digital signal by using an analog to digital converter, in order to cause a microprocessor system (CPU) to execute processing in accordance with the key used to make an input.

Accordingly, the resistor string must be configured to generate a voltage change larger than a resolution of the analog to digital converter in accordance with a key input. However, it is difficult to excessively raise a power supply potential, and hence the number of keys to be assigned to one resistor string is inevitably limited.

It is thus necessary to increase the number of resistor strings with the increase in number of keys to be arranged. At the same time, it is also necessary to increase the number of analog to digital converters corresponding thereto. However, the analog to digital converter is relatively large, which leads to a problem of increase in circuit size and electric power consumption as the number of keys to be arranged, namely, the number of analog to digital converters is increased.

SUMMARY OF THE INVENTION

The present invention is thus made to overcome such a problem, and an object of the present invention is to provide a key input device allowing for an increase in number of keys to be arranged while suppressing increase in circuit size.

According to an aspect of the present invention, the present invention is a key input device identifying a key used to make an input, out of a plurality of keys. The key input device according to the present invention includes: a control unit; a plurality of resistor string units each configured to generate a resistance value corresponding to an input, the plurality of resistor string units having one ends thereof connected to each other at a connection node; and a selection unit connected to the plurality of resistor string units, and electrically connecting one of the plurality of resistor string units between a first potential and a second potential in accordance with a selection command from the control unit. Each of the plurality of keys is uniquely assigned to any of the plurality of resistor string units. The control unit identifies the key used to make the input, based on a voltage value appearing at the connection node and the selection command provided to the selection unit.

Preferably, each of the plurality of resistor string units is made of a plurality of resistors connected in series, and a plurality of key switches arranged to correspond to the resistors, and short-circuiting one ends of the resistors corresponding thereto and the other end of the each of the plurality of resistor string units in accordance with the inputs made by the keys assigned thereto, respectively.

More preferably, the key input device further includes an analog to digital converter for outputting, as a digital signal, the voltage value appearing at the connection node to the control unit. The control unit identifies the key used to make the input, based on the digital signal from the analog to digital converter.

Still preferably, the control unit outputs the selection command such that one of the plurality of resistor string units is sequentially selected to be electrically connected between the first potential and the second potential.

Still preferably, the control unit outputs the selection command such that only one of the resistor string units, where any key that is allowed to make an input is assigned out of the plurality of keys, is electrically connected between the first potential and the second potential.

According to the present invention, it is possible to implement the key input device allowing for an increase in number of keys to be arranged while suppressing increase in circuit size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will hereinafter be described in detail with reference to the drawings. The same or corresponding portions therein are provided with the same reference characters, and the description thereof will not be repeated.

Figure 1:
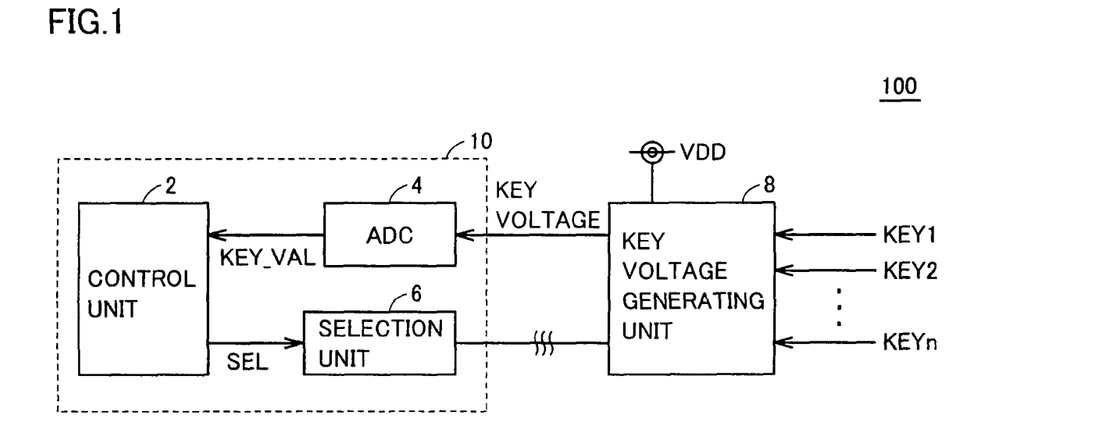
FIG. 1 is a schematic configuration diagram of a key input device according to an embodiment of the present invention.

Referring to FIG. 1, a key input device 100 according to an embodiment of the present invention identifies a key used to make an input, out of a plurality of keys KEY1, KEY2, . . . , KEYn, and outputs a result of the identification to a control device or the like not shown. Key input device 100 is formed of a key voltage generating unit 8, an analog to digital converter (ADC) 4, a selection unit 6, and a control unit 2. In the embodiment of the present invention, there is illustrated, as an example, a case where control unit 2, analog to digital converter 4, and selection unit 6 are implemented by a single microcomputer 10.

Key voltage generating unit 8 is configured to allow a plurality of keys KEY1, KEY2, . . . , KEYn to make inputs therein, and outputs a key voltage corresponding to a key used to make an input to analog to digital converter 4. Specifically, key voltage generating unit 8 includes a plurality of resistor string units having one ends connected to each other at a connection node, and each of the plurality of resistor string units is configured to generate a resistance value corresponding to the key used to make an input. Each of the plurality of keys KEY1, KEY2, . . . , KEYn is uniquely assigned to any of the resistor string units. Note that the "key voltage" in the following description refers to a voltage value with respect to a ground potential.

Analog to digital converter 4 converts a voltage value (an analog value) of the key voltage generated by key voltage generating unit 8 into a digital signal, and outputs a key voltage value KEY_VAL (a digit value) to control unit 2.

Selection unit 6 is connected to key voltage generating unit 8, and electrically connects one of the plurality of resistor string units included in key voltage generating unit 8, between a power supply potential VDD and a ground potential in accordance with a selection command SEL from control unit 2.

Control unit 2 identifies the key used to make an input, based on key voltage value KEY_VAL received from analog to digital converter 4 and selection command SEL provided to selection unit 6. Specifically, control unit 2 determines which resistor string unit is electrically connected between power supply potential VDD and the ground potential, based on selection command SEL provided to selection unit 6, and identifies the key corresponding to key voltage value KEY_VAL received from analog to digital converter 4, out of the keys assigned to the determined resistor string unit.

Figure 2:
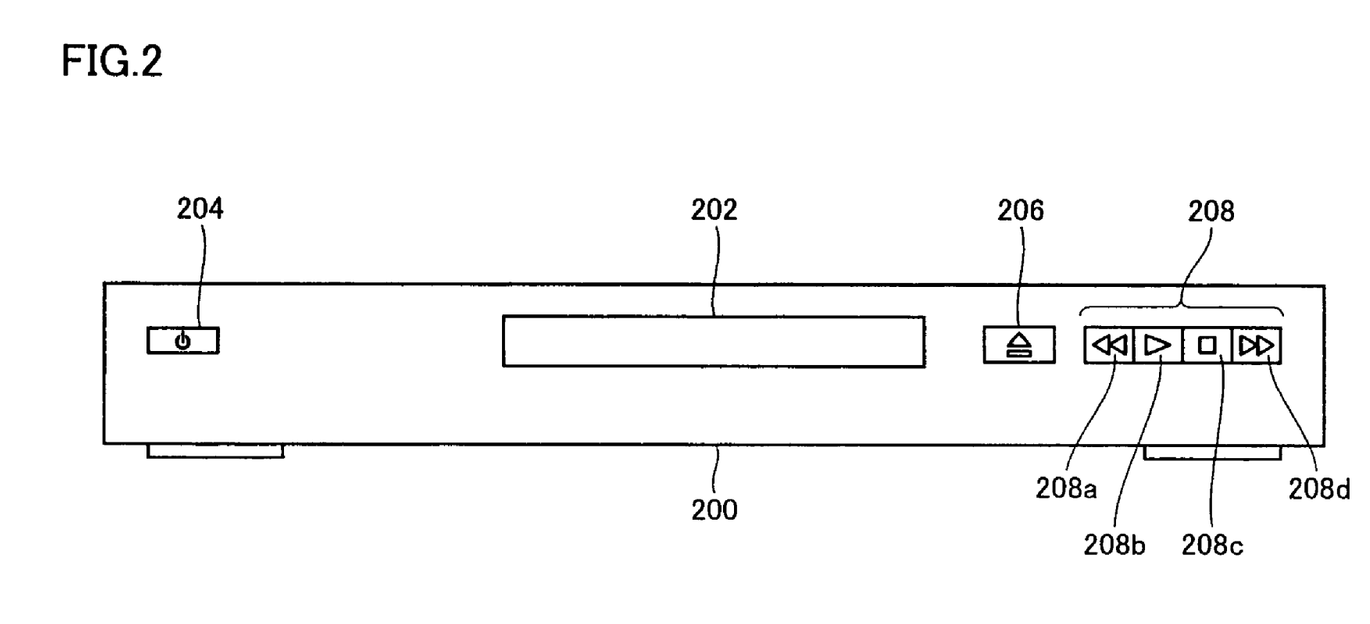
FIG. 2 is an external view showing an example of a disk drive provided with the key input device according to the embodiment of the present invention.

FIG. 2 is an external diagram showing an example of a disk drive 200 provided with key input device 100 according to the embodiment of the present invention.

Referring to FIG. 2, one end of a disk tray 202 for installing a medium disk is formed in an openable/closable manner at a panel surface of disk drive 200 such as a Digital Versatile Disk (DVD) player, a DVD recorder, or a Compact Disk (CD) player. Furthermore, as an example, a power supply key 204, a disk tray open/close key 206, and a replay manipulation key group 208 are arranged at the panel surface of disk drive 200.

Replay manipulation key group 208 includes a rewind key 208a, a replay key 208b, a stop key 208c, a fast-forward key 208d, and others.

The key voltage generating unit (FIG. 1) is arranged to operate upon receipt of an input manipulation through each of the keys (e.g. a pressing force or the like), and generates a key voltage corresponding to a key used to make an input. When control unit 2 (FIG. 1) determines that an input is made by power supply key 204, it issues an activation command to a power supply unit (now shown) and others in disk drive 200. Similarly, when control unit 2 determines that key inputs are made by disk tray open/close key 206 and replay manipulation key group 208, respectively, it issues a command corresponding to each of the keys.

Figure 3:
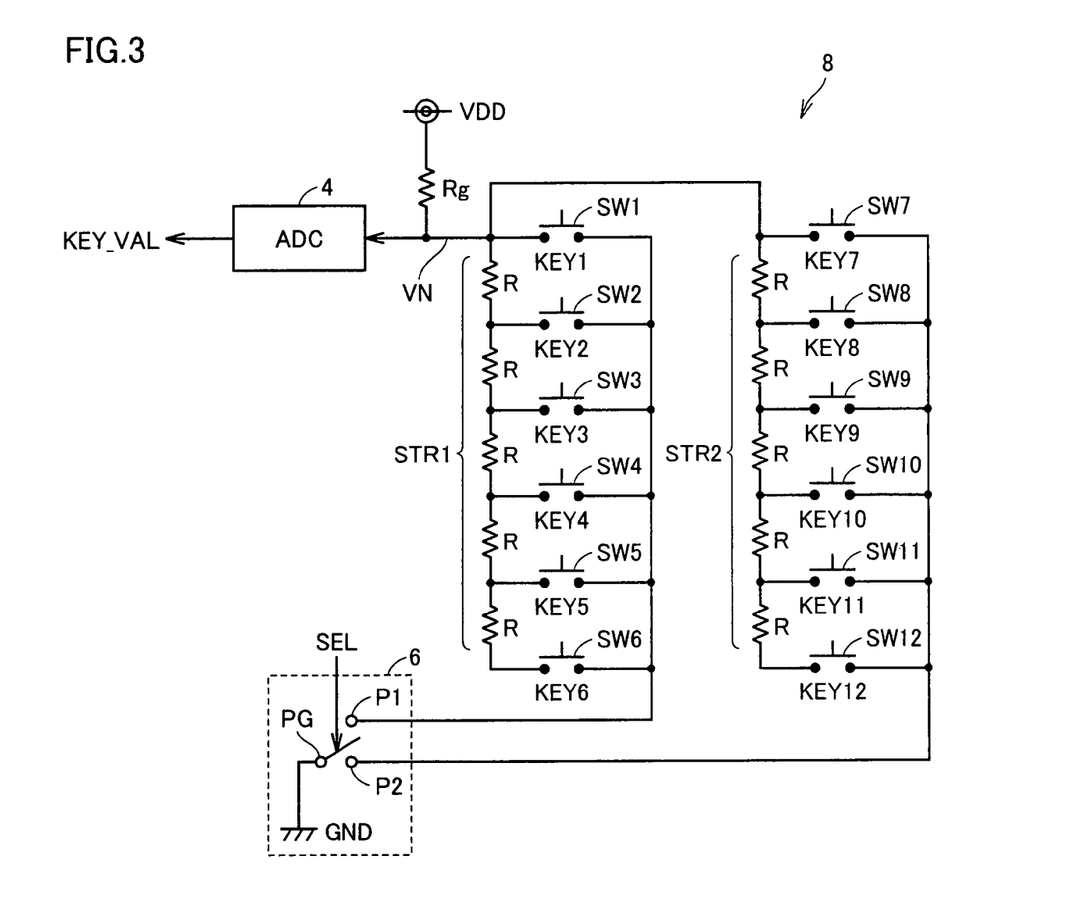
FIG. 3 is a diagram showing a substantial part of the key input device according to the embodiment of the present invention.

Referring to FIG. 3, key voltage generating unit 8 includes, as an example, a resistor string unit STR1 having keys KEY1-KEY6 assigned thereto, and a resistor string unit STR2 having keys KEY7-KEY12 assigned thereto. Resistor string units STR1 and STR2 have one ends connected to each other at a connection node VN, and connection node VN is connected to power supply potential VDD via a limiting resistor Rg. Resistor string units STR1 and STR2 have the other ends connected to selection unit 6 independently.

Resistor string unit STR1 is made of five resistors R connected in series and six key switches SW1-SW6 arranged to correspond to resistors R. Key switches SW1-SW6 short-circuit one ends of resistors R corresponding thereto, and a termination of resistor string unit STR1 (an end at the side of selection unit 6), in accordance with inputs made by keys KEY1-KEY6 assigned thereto, respectively.

Similarly, resistor string unit STR2 is made of five resistors R connected in series and six key switches SW7-SW12 arranged to correspond to resistors R. Key switches SW7-SW12 short-circuit one ends of resistors R corresponding thereto, and a termination of resistor string unit STR2 (an end at the side of selection unit 6), in accordance with inputs made by keys KEY7-KEY12 assigned thereto, respectively.

Selection unit 6 electrically connects any one of resistor string units STR1 and STR2 to ground potential GND, in accordance with selection command SEL from control unit 2 (FIG. 1). In other words, selection unit 6 electrically connects any one of resistor string units STR1 and STR2 between power supply potential VDD and ground potential GND, in accordance with selection command SEL. Specifically, selection unit 6 electrically connects a port PG connected to ground potential GND to any one of a port P1 connected to the other end of resistor string unit STR1 and a port P2 connected to the other end of resistor string unit STR2.

When an input is made by any of the keys in resistor string unit STR1 or STR2 selected in accordance with selection command SEL, a shoot-through current flows from power supply potential VDD to ground potential GND through the key switch corresponding to the key used to make an input. A key voltage appearing at connection node VN changes in accordance with a path through which the shoot-through current flows.

Figure 4:
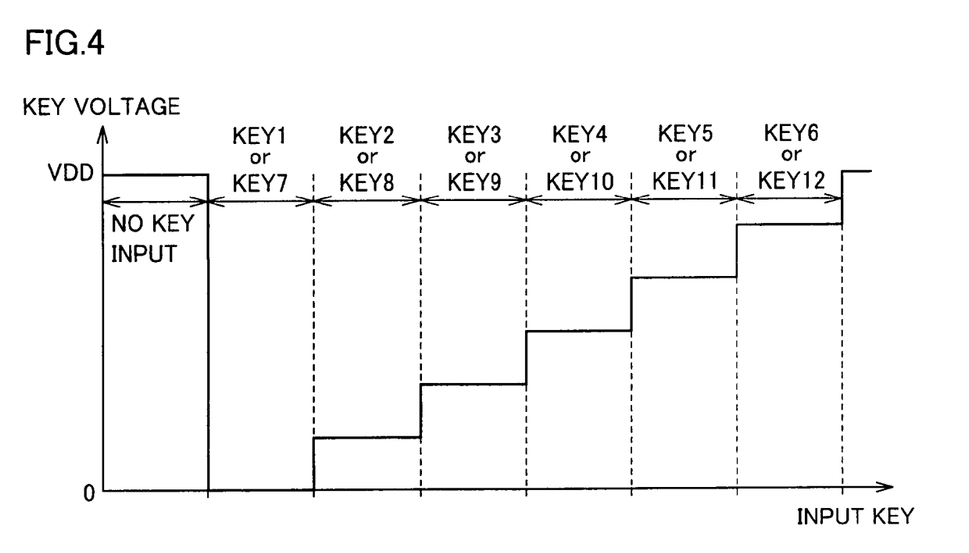
FIG. 4 is a diagram showing a relation between a key used to make an input and a key voltage appearing at a connection node.

Referring to FIGS. 3 and 4, when no input is made by any of the keys, a current path from power supply potential VDD to ground potential GND is not formed, and hence a shoot-through current does not flow. Accordingly, power supply potential VDD appears as a key voltage at connection node VN.

Next, when an input is made by key KEY1 or KEY7, connection node VN is electrically connected to ground potential GND via key switch SW1 or SW7 corresponding thereto. Accordingly, ground potential GND appears as a key voltage at connection node VN.

When an input is made by key KEY2 or KEY8, there is generated a shoot-through current passing from power supply potential VDD through limiting resistor Rg and one resistor R on the power supply potential side to ground potential GND via key switch SW2 or SW8 corresponding thereto. Accordingly, there appears, as a key voltage at connection node VN, a voltage obtained by dividing power supply potential VDD in accordance with the ratio of resistance of limiting resistor Rg to resistance of resistor R.

Similarly, when an input is made by key KEY3 or KEY9, there appears at connection node VN a voltage obtained by dividing power supply potential VDD in accordance with the ratio of resistance of limiting resistor Rg to resistance of two resistors R. When an input is made by key KEY4 or KEY10, there appears at connection node VN a voltage obtained by dividing power supply potential VDD in accordance with the ratio of resistance of limiting resistor Rg to resistance of three resistors R. When an input is made by key KEY5 or KEY11, there appears at connection node VN a voltage obtained by dividing power supply potential VDD in accordance with the ratio of resistance of limiting resistor Rg to resistance of four resistors R. When an input is made by key KEY6 or KEY12, there appears at connection node VN a voltage obtained by dividing power supply potential VDD in accordance with the ratio of resistance of limiting resistor Rg to resistance of five resistors R.

As such, control unit 2 identifies the key used to make an input, in accordance with the key voltage appearing at connection node VN. Furthermore, in the embodiment of the present invention, in order to determine whether an input is made or not by any of keys KEY1-KEY12, control unit 2 sequentially switches between the resistor string units such that they are electrically connected between power supply potential VDD and ground potential GND in an alternate manner.

Figure 5:
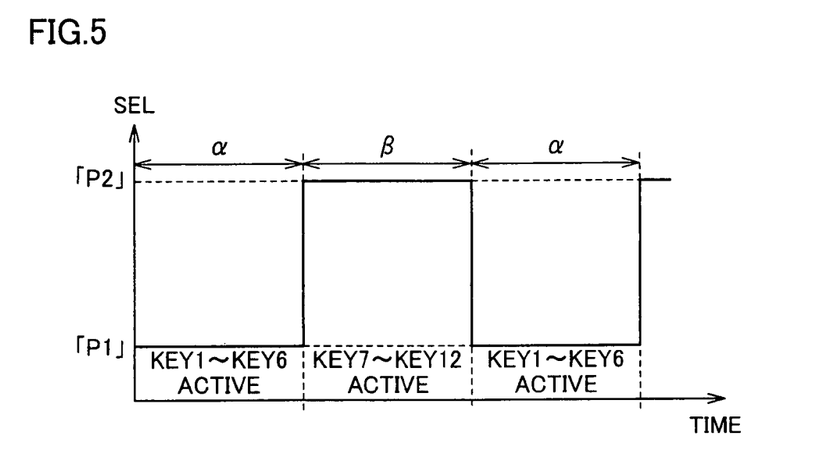
FIG. 5 is a diagram showing a temporal waveform of a selection command output from a control unit.

Referring to FIG. 5, control unit 2 outputs selection command SEL such that the resistor string units are switched to be alternately connected between power supply potential VDD and ground potential GND in a predetermined cycle. In other words, control unit 2 switches selection command SEL in a predetermined cycle, between "P1" indicating that port PG should be connected to port P1 and "P2" indicating that port PG should be connected to port P2.

In a period when selection command SEL is at "P1" (period α), keys KEY1-KEY6 are made active, so that control unit 2 can identify which key is used for making an input, out of keys KEY1-KEY6. In a period when selection command SEL is at "P2" (period β), keys KEY7-KEY12 are made active, so that control unit 2 can identify which key is used for making an input, out of keys KEY7-KEY12.

As such, by allowing control unit 2 to generate selection command SEL for sequentially select one of the resistor string units, it is possible to determine, by means of the single analog to digital converter 4, whether an input is made or not by each of the multiple keys.

Figure 6A:
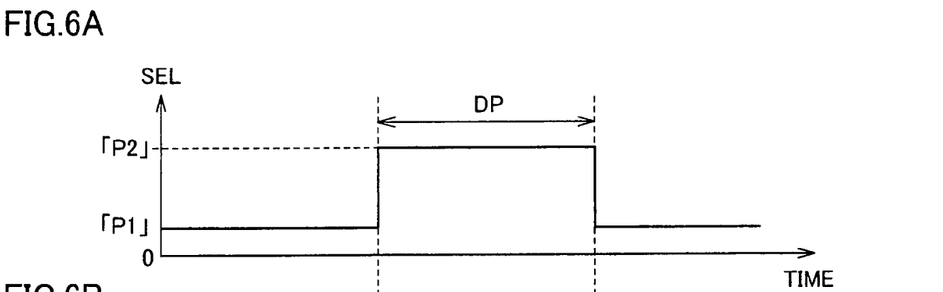
FIGS. 6A and 6B are diagrams for describing a process of identifying the key used to make an input.
Figure 6B:
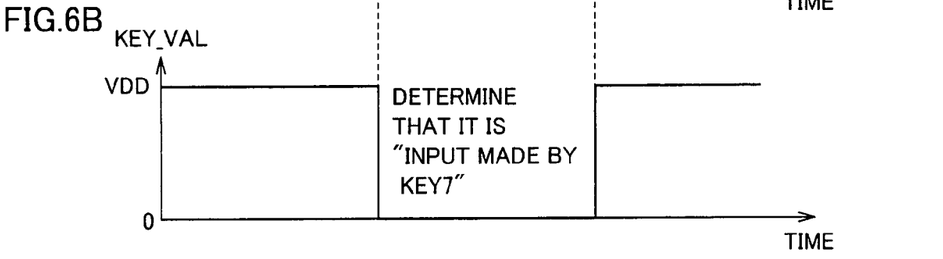

FIGS. 6A and 6B are diagrams for describing a process of identifying a key used to make an input.

FIG. 6A shows a temporal change in selection command SEL.

FIG. 6B shows a temporal change in key voltage value KEY_VAL.

Referring to FIG. 6A, as described above, control unit 2 generates selection command SEL for sequentially switching between the resistor string units such that the resistor string units are electrically connected between power supply potential VDD and ground potential GND in an alternate manner. In synchronization with this selection command SEL, control unit 2 determines whether a key input is made or not, based on key voltage value KEY_VAL. Referring to FIG. 6B, control unit 2 determines that no input is made by any of the keys when key voltage value KEY_VAL is at power supply potential VDD.

When key voltage value KEY_VAL assumes "0" (ground potential GND) in a period when selection command SEL is switched to "P2" (period DP), control unit 2 detects an input made by "key KEY7" that has key voltage value KEY_VAL corresponding to "0", out of keys KEY7-KEY12 assigned to the selected resistor string unit STR2.

As such, control unit 2 identifies a key used to make an input, based on key voltage value KEY_VAL received from analog to digital converter 4 and selection command SEL provided to selection unit 6.

Actually, even in the same key input, key voltage value KEY_VAL output from analog to digital converter 4 fluctuates depending on voltage fluctuations of power supply potential VDD and temperature conditions. Accordingly, it is desirable that a threshold range corresponding to each of the keys is set in advance, and that a key used to make an input is identified based on whether or not the key voltage value falls within the threshold range.

In the above-described description, there is illustrated a configuration in which the resistor string units are sequentially switched in a predetermined cycle such that they are electrically connected between power supply potential VDD and ground potential GND in an alternate manner. However, a switching cycle and a switching order are not limited to the above-described example. In other words, a particular resistor string unit may be made active for a required period, in accordance with properties of a device (e.g. a disk drive or the like) into which the key input device is incorporated, and types of keys used to make an input.

In disk drive 200 as shown in FIG. 2, for example, there is no need to accept an input by replay manipulation key group 208 until after an input is made by power supply key 204. In other words, there is no need to identify a key input by replay manipulation key group 208 unless disk drive 200 is in a power-on state. Accordingly, it is possible to more efficiently identify a key used to make an input by assigning to resistor string unit STR1 power supply key 204 and disk tray open/close key 206, which can be used to make an input regardless of the power-on state of disk drive 200, assigning to resistor string unit STR2 replay manipulation key group 208, which can be used to make an input only after the power-on of disk drive 200, and generating selection command SEL as described below.

Figure 7:
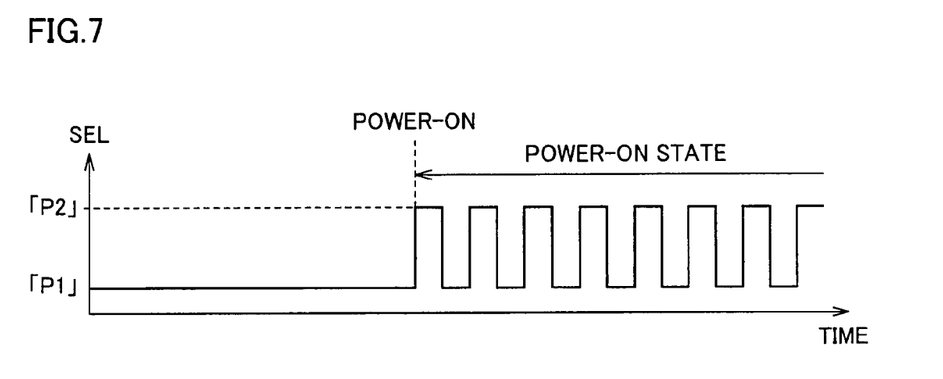
FIG. 7 is a diagram showing a temporal waveform of a selection command directed to the disk drive.

Referring to FIG. 7, when disk drive 200 is not in the power-on state, control unit 2 fixes selection command SEL at "P1". In other words, control unit 2 only makes active resistor string unit STR1, which has power supply key 204 and disk tray open/close key 206 assigned thereto. As to the keys assigned to resistor string unit STR2, no determination is made as to whether or not an input is made thereby.

Subsequently, when power is turned on to bring disk drive 200 into a power-on state, control unit 2 alternately switches selection command SEL between "P1" and "P2" in a predetermined cycle. Resistor string units STR1 and STR2 are thus made active alternately, so that it is possible to determine whether or not an input is made by the key assigned to each of the resistor string units.

As such, control unit 2 outputs selection command SEL such that only the resistor string unit, where any key that can be used to make an input is assigned out of a plurality of keys, is electrically connected between power supply potential VDD and ground potential GND and made active. Accordingly, an unnecessary selection operation at selection unit 6 is suppressed, and electric power consumption associated with the selection operation can be reduced.

In the above-described description, there is illustrated a key input device configured with two resistor string units STR1 and STR2. However, it is of course possible to configure the key input device with at least three resistor string units.

Figure 8:
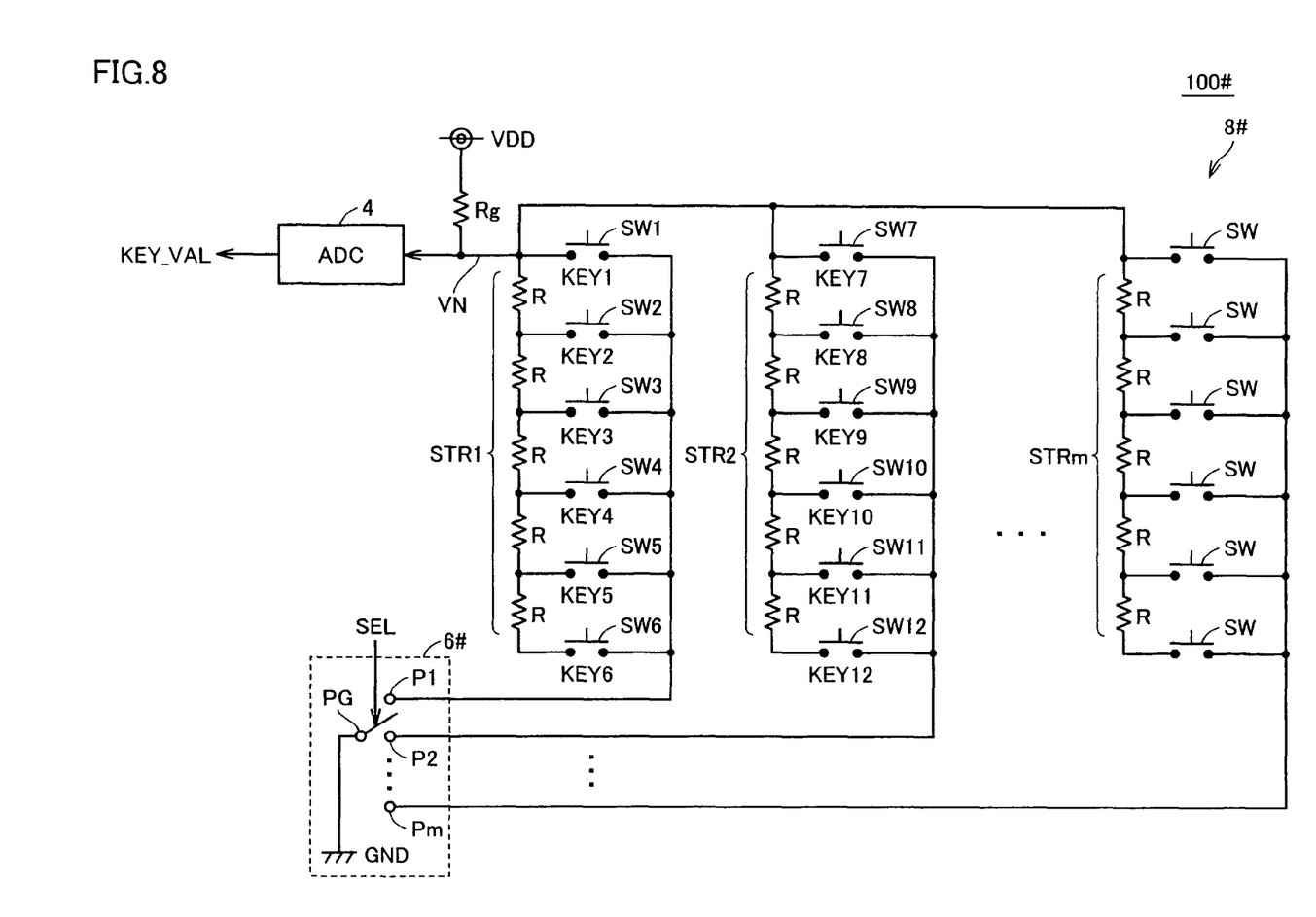
FIG. 8 is a diagram showing a substantial part of a key input device configured with at least three resistor string units.

Referring to FIG. 8, a key input device 100# configured with at least three resistor string units is equivalent to key input device 100 shown in FIG. 3 where key voltage generating unit 8 is replaced with key voltage generating unit 8#, and selection unit 6 is replaced with selection unit 6#.

Key voltage generating unit 8# is configured to include m resistor string units STR1, STR2, . . . , STRm. Each of resistor string units STR1, STR2, . . . , STRm is similar to the above-described resistor string units STR1 and STR2, and hence the detailed description thereof will not be repeated.

Selection unit 6# electrically connects one of m resistor string units STR1, STR2, . . . , STRm between power supply potential VDD and the ground potential, in accordance with selection command SEL from control unit 2.

A process of identifying a key used to make an input is similar to that described above, except that the number of resistor string units is increased, and hence the detailed description thereof will not be repeated.

In the foregoing, there is described a configuration in which connection node VN is located at a higher potential, namely, on the power supply potential VDD side, and detected as a key voltage. However, there may be provided a configuration in which the connection node is located on the ground potential GND side. The resistors with which the resistor string unit is configured are not necessarily required to have the same resistance values, and an appropriate resistance value may be selected in accordance with properties of the analog to digital converter and others.

According to the embodiments of the present invention, one ends of the plurality of resistor string units each configured to generate a resistance value corresponding to a key used to make an input, are electrically connected to power supply potential VDD (at connection node VN), and selection unit 6 electrically connects one of the plurality of resistor string units to ground potential GND, in accordance with selection command SEL from control unit 2. One resistor string unit corresponding to selection command SEL is thereby electrically connected between power supply potential VDD and ground potential GND, and a voltage value corresponding to the key used to make an input into the resistor string unit appears at connection node VN. Accordingly, the control unit can identify the key used to make an input, based on the voltage value appearing at connection node VN and selection command SEL provided to selection unit 6.

As such, even in the case where a key input device is configured to include multiple of resistor string units to arrange a plurality of keys, only one analog to digital converter is needed for detecting a voltage value at connection node VN, where the resistor string units are collectively connected thereto. It is therefore possible to implement a key input device allowing for increase in number of keys to be arranged while suppressing increase in circuit size.

Furthermore, according to the embodiments of the present invention, selection command SEL is output such that only the resistor string unit, where a key that is allowed to make an input (e.g. a power supply key and a replay manipulation key group) is assigned, is electrically connected between power supply potential VDD and ground potential GND and made active, in accordance with a power-on state of an electrical appliance (e.g. a disk drive) having the key input device according to the present invention embedded therein. Accordingly, a determination as to whether or not an input is made by the key that is not allowed to make an input is eliminated, so that an unnecessary switching operation can be suppressed. Accordingly, a determination as to whether or not an input is made is limited to minimum necessary keys, so that it is possible to make the determination efficient and suppress increase in electric power consumption associated with the unnecessary switching operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A key input device identifying a key used to make an input, out of a plurality of keys, comprising:
   a control unit;
   a plurality of resistor string units each configured to generate a resistance value corresponding to an input, the plurality of resistor string units being connected to each other at a connection node at one end of the plurality of resistor string units; and
   a selection unit connected to said plurality of resistor string units, and electrically connecting one of said plurality of resistor string units between a first potential and a second potential in accordance with a selection command from said control unit,
   wherein each of the plurality of keys is uniquely assigned to any of said plurality of resistor string units,
   said control unit identifies the key used to make the input, based on a voltage value appearing at said connection node and said selection command provided to said selection unit, and
   said control unit outputs said selection command such that one of said plurality of resistor string units is sequentially selected to be electrically connected between said first potential and said second potential.

2. The key input device according to claim 1, wherein each of said plurality of resistor string units includes a plurality of resistors connected in series, and
   a plurality of key switches arranged to correspond to the resistors, and short-circuiting one end of the resistors corresponding thereto and the other end of the each of said plurality of resistor string units in accordance with the inputs made by the keys assigned thereto, respectively.

3. The key input device according to claim 1, further comprising an analog to digital converter for outputting, as a digital signal, the voltage value appearing at said connection node to said control unit, wherein said control unit identifies the key used to make the input, based on said digital signal from said analog to digital converter.

4. The key input device according to claim 1, wherein said control unit outputs said selection command such that only one of said resistor string units, where any key that is allowed to make an input is assigned out of said plurality of keys, is electrically connected between said first potential and said second potential.

5. A key input device identifying a key used to make an input, out of a plurality of keys, comprising:
   a control unit;
   a plurality of resistor string units each configured to generate a resistance value corresponding to an input, the plurality of resistor string units being connected to each other at a connection node at one end of the plurality of resistor string units; and a selection unit connected to said plurality of resistor string units, and electrically connecting one of said plurality of resistor string units between a first potential and a second potential in accordance with a selection command from said control unit, wherein each of the plurality of keys is uniquely assigned to any of said plurality of resistor string units, said plurality of resistor string units includes:
  a first resistor string to which at least a power supply key is assigned, and
  a second resistor string to which the key is assigned for accepting an input subsequent to the input of said power supply key, said control unit identifies the key used to make the input, based on a voltage value appearing at said connection node and said selection command provided to said selection unit, said selection unit is configured to:
  electrically connect said first resistor string to said second potential not in a power-on state, and
  electrically connect said first and second resistor strings to said second potential in an alternate manner after the power-on state is set in response to the input of said power supply key.

6. The key input device according to claim 5, wherein each of said plurality of resistor string units includes:
  a plurality of resistors connected in series, and
  a plurality of key switches arranged to correspond to the resistors, and
  short-circuiting one end of the resistors corresponding thereto and the other end of the each of said plurality of resistor string units in accordance with the inputs made by the keys assigned thereto, respectively.

7. The key input device according to claim 5, further comprising an analog to digital converter for outputting, as a digital signal, the voltage value appearing at said connection node to said control unit, wherein
  said control unit identifies the key used to make the input, based on said digital signal from said analog to digital converter.

8. The key input device according to claim 5, wherein said control unit outputs said selection command such that one of said plurality of resistor string units is sequentially selected to be electrically connected between said first potential and said second potential.

9. The key input device according to claim 5, wherein said control unit outputs said selection command such that only one of said resistor string units, where any key that is allowed to make an input is assigned out of said plurality of keys, is electrically connected between said first potential and said second potential.

10. A key input device identifying a key used to make an input, out of a plurality of keys, comprising:
  a control unit;
  a plurality of resistor string units each configured to generate a resistance value corresponding to an input, the plurality of resistor string units being connected to each other at a connection node at one end of the plurality of resistor string units;
  a limiting resistor connected to a power supply potential and a ground potential;
  a selection unit connected between said plurality of resistor string unit and said ground potential, and electrically connecting one of said plurality of resistor string units to said ground potential in accordance with a selection command from said control unit;
  an analog to digital converter for outputting, as a digital signal, the voltage value appearing at said connection node to said control unit, wherein each of the plurality of keys is uniquely assigned to any of said plurality of resistor string units, each of said plurality of resistor string units includes:
  a plurality of resistors connected in series, and
  a plurality of key switches arranged to correspond to the resistors,
  short-circuiting one end of the resistor corresponding thereto and the other end of the each of the plurality of resistor string units in accordance with the inputs made by the keys assigned thereto, respectively, said plurality of resistor string units includes:
  a first resistor string to which at least a power supply key is assigned, and
  a second resistor string to which a replay manipulation key is assigned, said control unit identifies the key used to make the input, based on a voltage value appearing at said connection node and said selection command provided to said selection unit, said selection unit is configured to:
  electrically connect said first resistor string to said ground potential not in a power-on state, and
  electrically connect said ground and second resistor strings to said ground potential in an alternate manner after the power-on state is set in response to the input of said power supply key.

* * * * *